EPITAXIAL SEMICONDUCTOR MATERIAL ON DISSIMILAR SUBSTRATE AND METHOD FOR PRODUCING THE SAME
Filed June 22, 1966
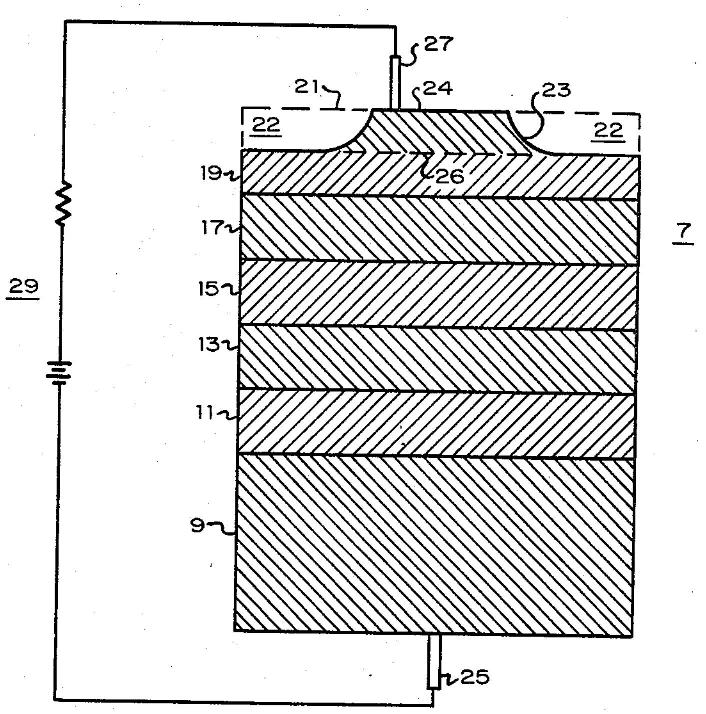
INVENTOR
RICHARD E. EWING
BY A. C. Smith
ATTORNEY United States Patent Office
3,493,811
Patented Feb. 3, 1970

3,493,811
EPITAXIAL SEMICONDUCTOR MATERIAL ON DISSIMILAR SUBSTRATE AND METHOD FOR PRODUCING THE SAME

Richard E. Ewing, Los Altos, Calif., assignor to Hewlett-Packard Company, Palo Alto, Calif., a corporation of California Filed June 22, 1966, Ser. No. 559,572
Int. Cl. H05b *41/29*
U.S. Cl. 315—169 5 Claims This invention relates to gallium arsenide-gallium phosphide semiconductor material and has as its principal object the provision of an epitaxial layer of such semiconductor material on a substrate of gallium arsenide semiconductor material for use in injection electroluminescent p-n junction diodes and has as another object the provision of the method for producing an epitaxial layer of semiconductor material on a substrate of dissimilar semiconductor material with a minimum of strain between the substrate and epitaxial layer due to the different lattice constants involved. By eliminating the conventional abrupt transition between lattice constants of the different materials, a diffusion front into the epitaxial layer is more uniformly produced and electroluminescence at the diffusion front is thus considerably more efficient than in conventional structures. This transition between lattice constants is accomplished in accordance with the illustrated embodiment of the present invention by grading the transition from the substrate material to the epitaxial layer of the desired material in several layers each having a selected composition.

In the drawing, the cross sectional view of injection electroluminescent p-n junction diode of the present invention shows a body 7 including a substrate 9 of gallium arsenide beneath several layers of varying composition. This body is prepared in a conventional manner as by placing a substrate of monocrystalline gallium arsenide near the lower-temperature end of a quartz reaction tube in a gradient furnace at a temperature of about 750 to 900 degrees C. A source of gallium is disposed near the higher-temperature end of the reaction tube at a temperature of about 800 to 1000 degrees C. Arsine is first introduced into the carrier gas which includes hydrogen and hydrogen chloride to form on the substrate 9 an epitaxial layer 11 of gallium arsenide having a thickness of about 3 microns or more. As this layer continues to grow, phosphine is introduced into the carrier gas at a slow rate to produce the graded composition layer 13 having a thickness of about 3 microns or more. When the gallium phosphide content of this layer attains a value of about 10–15%, a homogeneous layer 15 with this amount of gallium phosphide per unit volume is grown to a thickness of about 2 to 10 microns.

As the epitaxial growth is continued, additional amounts of phosphine are introduced at a slow rate to produce the layer 17 of graded composition having a thickness of 3 microns or more. When the gallium phosphide content of this layer attains the desired value, say 40%, the layer 19 is grown to any desired thickness, typically between 5 microns and 20 mils with the desired composition (gallium arsenide .6=phosphide .4) throughout. The surface 21 of the body thus formed is then prepared by conventional chemical and mechanical means and zinc or other acceptor impurities such as cadmium or certain transition elements such as manganese is diffused into the prepared surface 21 to form a diffused p-n junction region 23. The region 22 around the selected zinc diffusion area 24 is etched away to a depth below the lower limit 26 of zinc diffusion to expose the edge of the p-n junction thus formed.

Electrodes 25, 27 may be attached by conventional means to the substrate 9 and the zinc diffusion area 24, respectively, so that an external circuit 29 may be connected for energizing the device thus formed in such a manner as to emit radiation at a wavelength in the visible spectrum, typically at about 645 millimicrons.

I claim:

1. Semiconductor apparatus comprising:
- a monocrystalline substrate of one semiconductor material;
- a first epitaxial layer of said one semiconductor material on a surface of said substrate;
- a second epitaxial layer on said first epitaxial layer having a composition which varies with thickness from the composition of said first epitaxial layer to a composition including said one semiconductor material and a selected first fractional portion of another semiconductor material;
- a third epitaxial layer on said second epitaxial layer having a composition which is substantially uniform with thickness and which includes said one semiconductor material and said selected first fractional portion of said other semiconductor material;
- a fourth epitaxial layer on said third epitaxial layer having a composition which varies with thickness from the composition of said third epitaxial layer to a composition including said one semiconductor material and a second larger selected fractional portion of said other semiconductor material;
- a fifth epitaxial layer on said fourth epitaxial layer having a composition which is substantially uniform with thickness and which includes said one semiconductor material and said second larger fractional portion of said other semiconductor material; and
- means on said fifth layer forming a rectifying junction therewith.

2. Apparatus as in claim 1 wherein:
- said one semiconductor material is gallium arsenide; and
- said other semiconductor material is gallium arsenide-phosphide.

3. Apparatus as in claim 2 wherein the composition which includes said second larger fractional portion of said other semiconductor material is gallium arsenide .6=phosphide .4.

4. Apparatus as in claim 1 comprising circuit means connected to said substrate and to said means on the fifth layer for impressing an operating potential across said junction.

5. Apparatus as in claim 2 wherein:
- said means comprises a diffusion region including impurities of a material selected from the group including zinc, cadmium and in the transition elements including manganese; and a signal source connected to said substrate and to said diffusion region for applying signal thereto with sufficient amplitude and polarity to product electroluminescence in the region of the junction.

References Cited

UNITED STATES PATENTS

| | | | |
|---|---|---|---|
| 3,201,664 | 8/1965 | Adam | 148—175 X |
| 3,218,203 | 11/1965 | Ruehrwein | 148—175 |
| 3,224,913 | 12/1965 | Ruehrwein | 148—175 |
| 3,249,473 | 5/1966 | Holonyak | 148—175 |
| 3,261,726 | 7/1966 | Ruehrwein | 148—33.4 |
| 3,341,376 | 9/1967 | Spenke et al. | 148—175 |

JOHN W. HUCKERT, Primary Examiner

R. F. POLISSACK, Assistant Examiner

U.S. Cl. X.R.

148—175, 335; 313—108; 317—234, 235